US012627297B2

(12) United States Patent
Li et al.

(10) Patent No.: US 12,627,297 B2
(45) Date of Patent: May 12, 2026

(54) STRONG PUF CIRCUIT CAPABLE OF IMPLEMENTING MULTI-BIT PARALLEL XOR OPERATIONS

(71) Applicant: Wenzhou University, Zhejiang (CN)

(72) Inventors: Gang Li, Zhejiang (CN); Pengjun Wang, Zhejiang (CN); Junjie Zhou, Zhejiang (CN); Hui Li, Zhejiang (CN); Hao Ye, Zhejiang (CN)

(73) Assignee: Wenzhou University, Zhejiang (CN)

( * ) Notice: Subject to any disclaimer, the term of this patent is extended or adjusted under 35 U.S.C. 154(b) by 123 days.

(21) Appl. No.: 18/895,347

(22) Filed: Sep. 24, 2024

(65) Prior Publication Data

US 2025/0385678 A1     Dec. 18, 2025

(30) Foreign Application Priority Data

Jun. 14, 2024     (CN) .......................... 202410768740.3

(51) Int. Cl.
*H03K 19/17768* (2020.01)
*H03K 19/0944* (2006.01)
*H03K 19/21* (2006.01)

(52) U.S. Cl.
CPC ... *H03K 19/17768* (2013.01); *H03K 19/0944* (2013.01); *H03K 19/21* (2013.01)

(58) Field of Classification Search
None
See application file for complete search history.

(56) References Cited

U.S. PATENT DOCUMENTS

| | | | |
|---|---|---|---|
| 10,224,931 B1 * | 3/2019 | Wang ............... | H03K 19/00315 |
| 2024/0137019 A1 * | 4/2024 | Wang ............... | H03K 19/00315 |
| 2025/0148132 A1 * | 5/2025 | Li ........................... | G06F 21/75 |

* cited by examiner

*Primary Examiner* — Jany Richardson
(74) *Attorney, Agent, or Firm* — JCIPRNET

(57) ABSTRACT

A strong PUF circuit capable of implementing multi-bit parallel XOR operations comprises a presetting module, an interleaving module, a cascading module and a control module, wherein the control module controls the operating mode of the strong PUF circuit capable of implementing multi-bit parallel XOR operations to allow the strong PUF circuit capable of implementing multi-bit parallel XOR operations to operate in a PUF mode, a logic operation mode or a power control mode; when operating in the PUF mode, the strong PUF circuit capable of implementing multi-bit parallel XOR operations functions as a PUF circuit; when operating in the logic operation mode, the strong PUF circuit capable of implementing multi-bit parallel XOR operations realizes an XOR operation logic function; and when operating in the power control mode, the strong PUF circuit capable of implementing multi-bit parallel XOR operations realizes low-power standby.

9 Claims, 11 Drawing Sheets

☐ 1 (51.46%)    ■ 0 (48.54%)

☐ 1 (50.29%)    ■ 0 (49.71%)

1               0

STRONG PUF CIRCUIT CAPABLE OF IMPLEMENTING MULTI-BIT PARALLEL XOR OPERATIONS

CROSS-REFERENCE TO RELATED APPLICATION

This application claims the priority benefit of China application serial no. 202410768740.3, filed on Jun. 14, 2024. The entirety of the above-mentioned patent application is hereby incorporated by reference herein and made a part of this specification.

BACKGROUND

Technical Field

The invention relates to PUF circuits, in particular to a strong PUF circuit capable of implementing multi-bit parallel XOR operations.

Description of Related Art

At present, the study related to edge artificial intelligence (AI) is a focus in academia and industry and is an important category in numerous AI and IoT infrastructure chips. The large-scale application of edge AI chips to terminals allows for the deployment of AI algorithms and models on edge devices near a data source to perform calculation and inference. However, the calculation, storage and power of IoT chips represented by such edge AI chips are seriously limited, and data are generally processed on devices locally, leading to the risk of data leakage and security vulnerabilities and the requirement for extra security measures to protect the pravity and sensitive information of users. However, due to the limitation inn resources, it is difficult to deploy traditional classical encryption/decryption algorithms on these chips.

The physically unclonable function (PUF), as a chip fingerprint technique, can generate random, unique and tamper-proof chip feature keys by extracting random process deviations which are inevitably introduced during the chip fabrication process. The PUF technique can overcome the limitation in the deployment of traditional classical encryption/decryption algorithms on these chips. At present, PUF circuits have been added to edge AI chips to improve the security of the edge AI chips. However, the direct addition of the PUF circuits will inevitably increase the hardware resource consumption of the edge AI chips and reduce the calculation efficiency of the edge AI chips, thus affecting the deployment of the edge AI chips in edge nodes.

A common method used for improving the calculation efficiency of edge AI chips is to replace a complex multiply-accumulate operation with an XOR/XNOR logic algorithm, that is, by an XOR operation circuit in the edge AI chips. If the PUF circuit can be endowed with the XOR operation function to eliminate the XOR operation circuit, the PUF circuit and the XOR operation circuit will occupy a smaller area of the edge AI chips, thus reducing the area of the edge AI chips. This is of great significance for reducing the hardware resource consumption of the edge AI chips and improving the calculation efficiency of the edge AI chips.

SUMMARY

The technical issue to be settled by the invention is to provide a strong PUF circuit capable of implementing multi-bit parallel XOR operations, which can replace a separated PUF circuit and an XOR operation circuit to be applied to edge AI chips so as to reduce the area and hardware resource consumption of the edge AI chips and improve the calculation efficiency of the edge AI chips.

The technical solution adopted by the invention to settle the above technical issue is as follows: a strong PUF circuit capable of implementing multi-bit parallel XOR operations comprises a presetting module, an interleaving module, a cascading module and a control module, wherein the control module is used for controlling an operating mode of the strong PUF circuit capable of implementing multi-bit parallel XOR operations, and under the control of the control module, the strong PUF circuit capable of implementing multi-bit parallel XOR operations is able to operate in a PUF mode, a logic operation mode or a power control mode; in a case where the strong PUF circuit capable of implementing multi-bit parallel XOR operations operates in the PUF mode, the cascading module is used for controlling the presetting module to generate two reverse response values, and the interleaving module is used for alternately selecting the two response values generated by the presetting module as PUF response outputs of the strong PUF circuit capable of implementing multi-bit parallel XOR operations; in a case where the strong PUF circuit capable of implementing multi-bit parallel XOR operations operates in the logic operation mode, the cascading module is used for inputting XOR operation data, controlling the presetting module to generate an XOR operation result and an XNOR operation result and outputting the XOR operation result and the XNOR operation result; and in a case where the strong PUF circuit capable of implementing multi-bit parallel XOR operations operates in the power control mode, low-power operation of the strong PUF circuit capable of implementing multi-bit parallel XOR operations is realized.

In the case where the strong PUF circuit capable of implementing multi-bit parallel XOR operations operates in the PUF mode, the presetting module is able to improve the stability of the two generated response values by screening out instable bits, so as to reduce the bit error rate.

The presetting module has a power terminal, a pre-charge terminal, n left screening signal input terminals, n right screening signal input terminals and two output terminals, wherein n is an integer which is greater than or equal to 1, the two output terminals of the presetting module are referred to as a first output terminal and a second output terminal respectively, an operating supply voltage VDD is accessed to the power terminal of the presetting module, a pre-charge signal PRE is input to the pre-charge terminal of the presetting module, n left screening signals SL1-SLn are input to the n left screening signal input terminals of the presetting module, and n right screening signals SR1-SRn are input to the n right screening signal input terminals of the presetting module; the interleaving module has two input terminals, a selection signal input terminal and an output terminal, the two input terminals of the interleaving module are referred to as a first input terminal and a second input terminal respectively, and a clock signal SW is input to the selection signal input terminal of the interleaving module; the cascading module has n signal input terminals, two input terminals and two output terminals, the two input terminals of the cascading module are referred to as a first input terminal and a second input terminal respectively, and the two output terminals of the cascading module are referred to a first output terminal and a second output terminal respectively; the control module has two input terminals, two control terminals, a pre-charge terminal and a ground terminal, the two input terminals of the control module are referred to a first input terminal and a second input terminal respectively, the two control terminals of the control module are referred to a first control terminal and a second control terminal respectively, a first control signal X is input to the first control terminal of the control module, a second control signal Y is input to the second control terminal of the control module, the pre-charge signal PRE is input to the pre-charge terminal of the control module, and a ground voltage VSS is accessed to the ground terminal of the control module; the first output terminal of the presetting module is connected to the first input terminal of the interleaving module and the first input terminal of the cascading module, the second output terminal of the presetting module is connected to the second input terminal of the interleaving module and the second input terminal of the cascading module, the first output terminal of the cascading module is connected to the first input terminal of the control module, and the second output terminal of the cascading module is connected to the second input terminal of the control module; in the case where the strong PUF circuit capable of implementing multi-bit parallel XOR operations operates in the logic operation mode, the n signal input terminals of the cascading module function as n data input terminals of the strong PUF circuit capable of implementing multi-bit parallel XOR operations and allow the XOR operation data to be input thereto, the first output terminal of the presetting module functions as a first output terminal of the strong PUF circuit capable of implementing multi-bit parallel XOR operations and is used for outputting the XOR operation result or the XNOR operation result, and the second output terminal of the presetting module functions as a second output terminal of the strong PUF circuit capable of implementing multi-bit parallel XOR operations and is used for outputting the XNOR operation result or the XOR operation result; and in the case where the strong PUF circuit capable of implementing multi-bit parallel XOR operations operates in the PUF mode, the n signal input terminals of the cascading module function as n challenge terminals of the strong PUF circuit capable of implementing multi-bit parallel XOR operations and allow challenge signals to be input thereto, and the output terminal of the interleaving module functions as a PUF response output terminal of the strong PUF circuit capable of implementing multi-bit parallel XOR operations and is used for outputting PUF responses.

The presetting module comprises a first PMOS transistor, a second PMOS transistor, a third PMOS transistor, a fourth PMOS transistor, n left screening cells and n right screening cells, wherein each left screening cell has a power terminal, two input terminals and an output terminal, and the two input terminals of the left screening cell are referred to as a first input terminal and a second input terminal respectively; each right screening cell has a power terminal, two input terminals and an output terminal, and the two input terminals of the right screening cell are referred to as a first input terminal and a second input terminal respectively; a source of the first PMOS transistor, a source of the second PMOS transistor, a source of the third PMOS transistor, a source of the fourth PMOS transistor, the power terminals of the n left screening cells and the power terminals of the n right screening cells are connected and a connecting terminal is the power terminal of the presetting module, a gate of the third PMOS transistor and a gate of the fourth PMOS transistor are connected and a connecting terminal is the pre-charge terminal of the presetting module, the first input terminals of the n left screening cells are the n left screening signal input terminals of the presetting module, the first input terminals of the n right screening cells are the n right screening signal input terminals of the presetting module, a drain of the first PMOS transistor, a gate of the second PMOS transistor, a drain of the third PMOS transistor, the second input terminals of the n right screening cells and the output terminals of the n left screening cells are connected and a connecting terminal is the first output terminal of the presetting module, and a drain of the second PMOS transistor, a gate of the first PMOS transistor, a drain of the fourth PMOS transistor, the output terminals of the n right screening cells and the second input terminals of the n left screening cells are connected and a connecting terminal is the second output terminal of the presetting module.

Each left screening cell comprises a fifth PMOS transistor and a sixth PMOS transistor, wherein a source of the fifth PMOS transistor is the power terminal of the left screening cell, a gate of the fifth PMOS transistor is the first input terminal of the left screening cell, a drain of the fifth PMOS transistor and a source of the sixth PMOS transistor are connected, a gate of the sixth PMOS transistor is the second input terminal of the left screening cell, and a drain of the sixth PMOS transistor is the output terminal of the left screening cell; each right screening cell comprises a seventh PMOS transistor and an eighth PMOS transistor, wherein a source of the seventh PMOS transistor is the power terminal of the right screening cell, a gate of the seventh PMOS transistor is the first input terminal of the right screening cell, a drain of the seventh PMOS transistor and a source of the eighth PMOS transistor are connected, a gate of the eighth PMOS transistor is the second input terminal of the right screening cell, and a drain of the eighth PMOS transistor is the output terminal of the right screening cell.

The interleaving module comprises a first inverter, a second inverter, a third inverter, a first NMOS transistor, a second NMOS transistor, a ninth PMOS transistor and a tenth PMOS transistor, wherein an input terminal of the first inverter is the first input terminal of the interleaving module, an input terminal of the second inverter is the second input terminal of the interleaving module, an output terminal of the first inverter, a drain of the first NMOS transistor and a source of the ninth PMOS transistor are connected, an output terminal of the second inverter, a drain of the second NMOS transistor and a source of the tenth PMOS transistor are connected, a gate of the first NMOS transistor and a gate of the tenth PMOS transistor are connected and a connecting terminal is the selection signal input terminal of the interleaving module, a gate of the ninth PMOS transistor and a gate of the second NMOS transistor are connected, a source of the first NMOS transistor, a drain of the ninth PMOS transistor, a source of the second NMOS transistor, a drain of the tenth PMOS transistor and an input terminal of the third inverter are connected, and an output terminal of the third inverter is the output terminal of the interleaving module.

The cascading module comprises n deviation cells, wherein each deviation cell has a signal input terminal, a first input terminal, a second input terminal, a first output terminal and a second output terminal, the signal input terminals of the n deviation cells are the n signal input terminals of the cascading module, the first input terminal of the first deviation cell is the first input terminal of the cascading module, the second input terminal of the first deviation cell is the second input terminal of the cascading module, the first output terminal of the kth deviation cell is connected to the first input terminal of the (k+1)th deviation cell, the second output terminal of the kth deviation cell is connected to the second input terminal of the (k+1)th deviation cell, k=1, 2, . . . , n−1, the first output terminal of the nth deviation cell is the first output terminal of the cascading module, and the second output terminal of the nth deviation cell is the second output terminal of the cascading module.

Each deviation cell comprises a third NMOS transistor, a fourth NMOS transistor, a fifth NMOS transistor, a sixth NMOS transistor and a fourth inverter, wherein an input terminal of the fourth inverter, a gate of the third NMOS transistor and a gate of the sixth NMOS transistor are connected and a connecting terminal is the signal input terminal of the deviation cell, a drain of the third NMOS transistor and a drain of the fourth NMOS transistor are connected and a connecting terminal is the first input terminal of the deviation cell, a drain of the fifth NMOS transistor and a drain of the sixth NMOS transistor are connected and a connecting terminal is the second input terminal of the deviation cell, a gate of the fourth NMOS transistor, a gate of the fifth NMOS transistor and an output terminal of the fourth inverter are connected, a source of the third NMOS transistor and a source of the fifth NMOS transistor are connected and a connecting terminal is the first output terminal of the deviation cell, and a source of the fourth NMOS transistor and a source of the sixth NMOS transistor are connected and a connecting terminal is the second output terminal of the deviation cell.

The control module comprises a first two-input AND gate, a second two-input AND gate, a seventh NMOS transistor and an eighth NMOS transistor, wherein the first two-input AND gate and the second two-input AND gate each have a first input terminal, a second input terminal and an output terminal, the first input terminal of the first two-input AND gate is the first control terminal of the control module, the first input terminal of the second two-input AND gate is the second control terminal of the control module, the second input terminal of the first two-input AND gate and the second input terminal of the second two-input AND gate are connected and a connecting terminal is the pre-charge terminal of the control module, a drain of the seventh NMOS transistor is the first input terminal of the control module, a drain of the eighth NMOS transistor is the second input terminal of the control module, a source of the seventh NMOS transistor and a source of the eighth NMOS transistor are connected and a connecting terminal is the ground terminal of the control module, a gate of the seventh NMOS transistor and the output terminal of the first two-input AND gate are connected, and a gate of the eighth NMOS transistor and the output terminal of the second two-input AND gate are connected.

Compared with the prior art, the invention has the following advantages: the strong PUF circuit capable of implementing multi-bit parallel XOR operations is formed by the presetting module, the interleaving module, the cascading module and the control module, wherein the control module controls the operating mode of the strong PUF circuit capable of implementing multi-bit parallel XOR operations to allow the strong PUF circuit capable of implementing multi-bit parallel XOR operations to operate in the PUF mode, the logic operation mode or the power control mode; when operating in the PUF mode, the strong PUF circuit capable of implementing multi-bit parallel XOR operations functions as a PUF circuit; when operating in the logic operation mode, the strong PUF circuit capable of implementing multi-bit parallel XOR operations realizes an XOR operation logic function; and when operating in the power control mode, the strong PUF circuit capable of implementing multi-bit parallel XOR operations realizes low-power standby. Therefore, the strong PUF circuit capable of implementing multi-bit parallel XOR operations provided by the invention not only can function as a PUF circuit, but also can function as an XOR operation circuit to be applied to edge AI chips to replace an XOR operation circuit, so as to reduce the area and hardware resource expenditure of the edge AI chips and improve the calculation efficiency of the edge AI chips.

DESCRIPTION OF THE EMBODIMENTS

The invention is described in further detail below in conjunction with the accompanying drawings.

Figure 1:
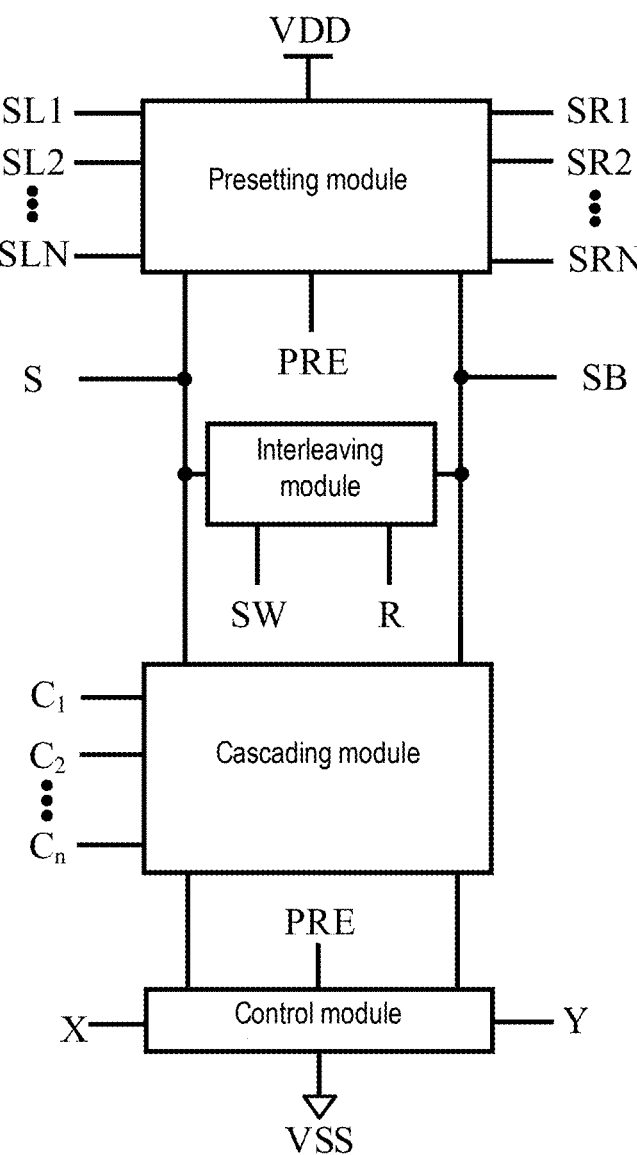
FIG. 1 is a structural diagram of a strong PUF circuit capable of implementing multi-bit parallel XOR operations according to the invention.

Embodiment 1: As shown in FIG. 1, a strong PUF circuit capable of implementing multi-bit parallel XOR operations comprises a presetting module, an interleaving module, a cascading module and a control module, wherein the control module is used for controlling an operating mode of the strong PUF circuit capable of implementing multi-bit parallel XOR operations, and under the control of the control module, the strong PUF circuit capable of implementing multi-bit parallel XOR operations is able to operate in a PUF mode, a logic operation mode or a power control mode; in a case where the strong PUF circuit capable of implementing multi-bit parallel XOR operations operates in the PUF mode, the cascading module is used for controlling the presetting module to generate two reverse response values, and the interleaving module is used for alternately selecting the two response values generated by the presetting module as PUF response outputs of the strong PUF circuit capable of implementing multi-bit parallel XOR operations; in a case where the strong PUF circuit capable of implementing multi-bit parallel XOR operations operates in the logic operation mode, the cascading module is used for inputting XOR operation data, controlling the presetting module to generate an XOR operation result and an XNOR operation result and outputting the XOR operation result and the XNOR operation result; and in a case where the strong PUF circuit capable of implementing multi-bit parallel XOR operations operates in the power control mode, low-power operation of the strong PUF circuit capable of implementing multi-bit parallel XOR operations is realized.

Embodiment 2: This embodiment is basically the same as Embodiment 1 and is different from Embodiment 1 in the following aspect: in this embodiment, in the case where the strong PUF circuit capable of implementing multi-bit parallel XOR operations operates in the PUF mode, the presetting module is able to improve the stability of the two generated response values by screening out instable bits, so as to reduce the bit error rate.

Embodiment 3: This embodiment is basically the same as Embodiment 2 and is different from Embodiment 2 in the following aspect: in this embodiment, the presetting module has a power terminal, a pre-charge terminal, n left screening signal input terminals, n right screening signal input terminals and two output terminals, wherein n is an integer which is greater than or equal to 1, the two output terminals of the presetting module are referred to as a first output terminal and a second output terminal respectively, an operating supply voltage VDD is accessed to the power terminal of the presetting module, a pre-charge signal PRE is input to the pre-charge terminal of the presetting module, n left screening signals SL1-SLn are input to the n left screening signal input terminals of the presetting module, and n right screening signals SR1-SRn are input to the n right screening signal input terminals of the presetting module; the interleaving module has two input terminals, a selection signal input terminal and an output terminal, the two input terminals of the interleaving module are referred to as a first input terminal and a second input terminal respectively, and a clock signal SW is input to the selection signal input terminal of the interleaving module; the cascading module has n signal input terminals, two input terminals and two output terminals, the two input terminals of the cascading module are referred to as a first input terminal and a second input terminal respectively, and the two output terminals of the cascading module are referred to a first output terminal and a second output terminal respectively; the control module has two input terminals, two control terminals, a pre-charge terminal and a ground terminal, the two input terminals of the control module are referred to a first input terminal and a second input terminal respectively, the two control terminals of the control module are referred to a first control terminal and a second control terminal respectively, a first control signal X is input to the first control terminal of the control module, a second control signal Y is input to the second control terminal of the control module, the pre-charge signal PRE is input to the pre-charge terminal of the control module, and a ground voltage VSS is accessed to the ground terminal of the control module; the first output terminal of the presetting module is connected to the first input terminal of the interleaving module and the first input terminal of the cascading module, the second output terminal of the presetting module is connected to the second input terminal of the interleaving module and the second input terminal of the cascading module, the first output terminal of the cascading module is connected to the first input terminal of the control module, and the second output terminal of the cascading module is connected to the second input terminal of the control module; in the case where the strong PUF circuit capable of implementing multi-bit parallel XOR operations operates in the logic operation mode, the n signal input terminals of the cascading module function as n data input terminals of the strong PUF circuit capable of implementing multi-bit parallel XOR operations and allow the XOR operation data to be input thereto, the first output terminal of the presetting module functions as a first output terminal of the strong PUF circuit capable of implementing multi-bit parallel XOR operations and is used for outputting the XOR operation result or the XNOR operation result, and the second output terminal of the presetting module functions as a second output terminal of the strong PUF circuit capable of implementing multi-bit parallel XOR operations and is used for outputting the XNOR operation result or the XOR operation result; and in the case where the strong PUF circuit capable of implementing multi-bit parallel XOR operations operates in the PUF mode, the n signal input terminals of the cascading module function as n challenge terminals of the strong PUF circuit capable of implementing multi-bit parallel XOR operations and allow challenge signals to be input thereto, and the output terminal of the interleaving module functions as a PUF response output terminal of the strong PUF circuit capable of implementing multi-bit parallel XOR operations and is used for outputting PUF responses.

In this embodiment, if the first control signal X input to the first control terminal of the control module and the second control signal Y input to the second control terminal of the control module are both high levels, the strong PUF circuit capable of implementing multi-bit parallel XOR operations operates in the PUF mode; if only one of the first control signal X input to the first control terminal of the control module and the second control signal Y input to the second control terminal of the control module is a high level, the strong PUF circuit capable of implementing multi-bit parallel XOR operations operates in the logic operation mode; and if the first control signal X input to the first control terminal of the control module and the second control signal Y input to the second control terminal of the control module are both low levels, the strong PUF circuit capable of implementing multi-bit parallel XOR operations operates in the power control mode. In the case where the strong PUF circuit capable of implementing multi-bit parallel XOR operations operates in the PUF mode, the strong PUF circuit capable of implementing multi-bit parallel XOR operations periodically generates and outputs PUF responses, and in each period, the strong PUF circuit capable of implementing multi-bit parallel XOR operations enters a pre-charge stage first and then enters an evaluation stage; if the pre-charge signal PRE is a low level, the strong PUF circuit capable of implementing multi-bit parallel XOR operations enters the pre-charge stage, at this moment, the presetting module charges the strong PUF circuit capable of implementing multi-bit parallel XOR operations, paths from the two input terminals to the ground terminal of the control module are cut off, and the two output terminals of the presetting module are charged to high levels; when the pre-charge signal PRE turns from the low level to a high level, the strong PUF circuit capable of implementing multi-bit parallel XOR operations enters the evaluation stage, the paths from the two input terminals to the ground terminal of the control module are turned on, the cascading module, under the control of the challenge signal input thereto, enables charges at the two output terminals of the presetting module to leak via the symmetrical paths respectively, the two output terminals of the presetting module have different pull-down current driving capacities due to the presence of inevitable random process deviations, and a period of time later, the presetting module generates a response value at each of the two output terminals according to a difference between voltages of the two output terminals and outputs the response value; at the evaluation stage, to improve the distribution uniformity of response values 0 and 1 output by the two output terminals of the presetting module to improve the randomness of PUF response values of the strong PUF circuit capable of implementing multi-bit parallel XOR operations in the PUF mode, the interleaving module, under the control of the clock signal SW, alternately selects the response values output by the two output terminals of the presetting module as PUF response outputs of the strong PUF circuit capable of implementing multi-bit parallel XOR operations; to improve the stability of the PUF response values of the strong PUF circuit capable of implementing multi-bit parallel XOR operations, n left screening signals SL1-SLn are input to the n left screening input terminals of the presetting module or n right screening signals SL1-SLn are input to the n right screening input terminals of the presetting module to allow for a valid low level at the n left screening input terminals or the n right screening input terminals of the presetting module, at this moment, a bias will be manually introduced between the two output terminals of the presetting module and change the probability distribution of the difference between the pull-down current driving capacities of the two output terminals of the presetting module to eliminate the case of a small difference, thus improving the stability of the response values output by the two output terminals of the presetting module. In the case where the strong PUF circuit capable of implementing multi-bit parallel XOR operations operates in the logic operation mode, the strong PUF circuit capable of implementing multi-bit parallel XOR operations enters the pre-charge stage first and then enters a calculation stage; if the pre-charge signal PRE is a low level, the strong PUF circuit capable of implementing multi-bit parallel XOR operations enters the pre-charge stage, and at this moment, the presetting module charges the strong PUF circuit capable of implementing multi-bit parallel XOR operations, the paths from the input terminals to the ground terminal of the control module are cut off, and the two output terminals of the presetting module are charged to high levels; when the pre-charge signal PRE turns from the low level to a high level, the strong PUF circuit capable of implementing multi-bit parallel XOR operations enters the calculation stage, at this moment, and only one of the paths from the two input terminals of the control module is turned on, that is, the path from one output terminal to the ground terminal of the cascading module is turned on and the path from the other output terminal to the ground terminal of the cascading module is cut off, wherein the path that is turned on pulls down the corresponding output terminal of the presetting module to the ground, and the path that is cut off holds the other output terminal of the resetting module at the high level; at this moment, if XY=10, the first output terminal of the presetting module outputs the XOR operation result of the XOR operation data input to the cascading module, and the second output terminal of the presetting module outputs the XNOR operation result of the XOR operation data input to the cascading module; or, if XY=01, the first output terminal of the presetting module outputs the XNOR operation result of the XOR operation data input to the cascading module, and the second output terminal of the presetting module outputs the XOR operation data input to the cascading module. In the case where the strong PUF circuit capable of implementing multi-bit parallel XOR operations operates in the power control mode, XY=00, the paths from the input terminals to the ground terminals of the control module are cut off, there will be no current path from the two output terminals to the ground terminal of the presetting module no matter what signals are input to the n signal input terminals of the cascading module, the two output terminals of the presetting module and the output terminal of the interleaving module are held at high levels, and at this moment, there exists only an extremely small leaking current, so the standby power of the strong PUF circuit capable of implementing multi-bit parallel XOR operations is extremely low.

Figure 2:
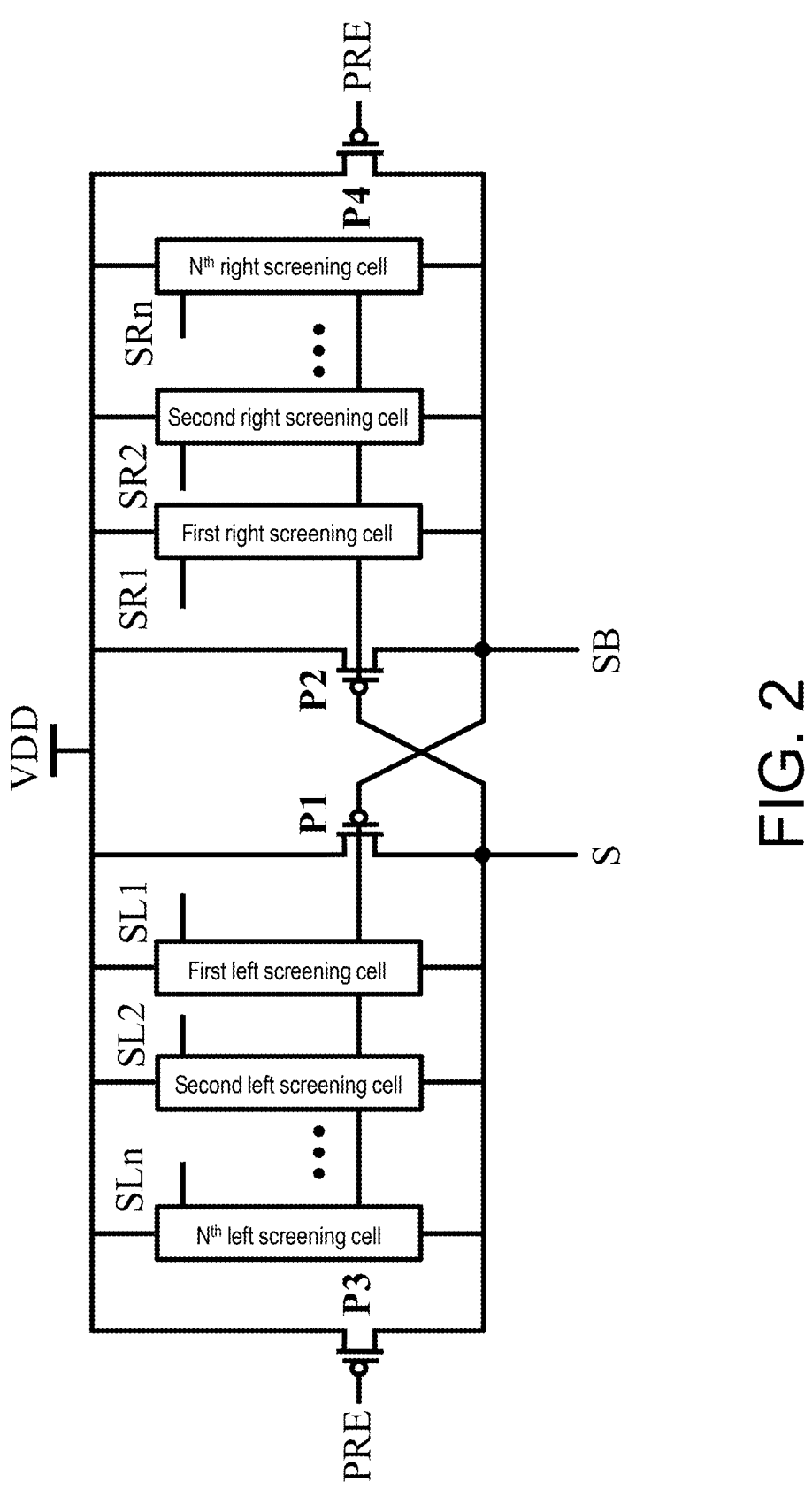
FIG. 2 is a structural diagram of a presetting module of the strong PUF circuit capable of implementing multi-bit parallel XOR operations according to the invention.

Embodiment 4: This embodiment is basically the same as Embodiment 3 and is different from Embodiment 3 in the following aspect: as shown in FIG. 2, in this embodiment, the presetting module comprises a first PMOS transistor P1, a second PMOS transistor P2, a third PMOS transistor P3, a fourth PMOS transistor P4, n left screening cells and n right screening cells, wherein each left screening cell has a power terminal, two input terminals and an output terminal, and the two input terminals of the left screening cell are referred to as a first input terminal and a second input terminal respectively; each right screening cell has a power terminal, two input terminals and an output terminal, and the two input terminals of the right screening cell are referred to as a first input terminal and a second input terminal respectively; a source of the first PMOS transistor P1, a source of the second PMOS transistor P2, a source of the third PMOS transistor P3, a source of the fourth PMOS transistor P4, the power terminals of the n left screening cells and the power terminals of the n right screening cells are connected and a connecting terminal is the power terminal of the presetting module, a gate of the third PMOS transistor P3 and a gate of the fourth PMOS transistor P4 are connected and a connecting terminal is the pre-charge terminal of the pre-setting module, the first input terminals of the n left screening cells are the n left screening signal input terminals of the presetting module, the first input terminals of the n right screening cells are the n right screening signal input terminals of the presetting module, a drain of the first PMOS transistor P1, a gate of the second PMOS transistor P2, a drain of the third PMOS transistor P3, the second input terminals of the n right screening cells and the output terminals of the n left screening cells are connected and a connecting terminal is the first output terminal of the presetting module, and a drain of the second PMOS transistor P2, a gate of the first PMOS transistor P1, a drain of the fourth PMOS transistor P4, the output terminals of the n right screening cells and the second input terminals of the n left screening cells are connected and a connecting terminal is the second output terminal of the presetting module.

In this embodiment, in the case where the strong PUF circuit capable of implementing multi-bit parallel XOR operations operates in the PUF mode, if the pre-charge signal PRE is a low level, the third PMOS transistor P3 and the fourth PMOS transistor P4, which function as pre-charge transistors, are turned on, and the first output terminal and the second output terminal of the presetting module are charged to high levels; and when the pre-charge signal PRE turns from the low level to a high level, the third PMOS transistor P3 and the fourth PMOS transistor, which function as pre-charge transistors, are turned off, the first output terminal and the second output terminal of the presetting module have different pull-down current driving capacities due to the presence of inevitable random process deviations, and a period of time later, the first PMOS transistor P1 and the second PMOS transistor P2, which function as determining transistors, of the presetting module are cross-coupled and connected and determine a difference between voltages of the first output terminal and the second output terminal of the presetting module to enable the first output terminal and the second output terminal of the presetting module to output two reverse response values, such that the response values are generated and output. The n left screening cells are controlled by means of the n left screening signals SL1-SLn, the n right screening cells are controlled by means of the n right screening signals SR1-SRn, and the n left screening signals SL1-SLn and the n right screening signals SR1-SRn are all valid low levels. In the case where the strong PUF circuit capable of implementing multi-bit parallel XOR operations operates in the PUF mode, when the presetting module is in the evaluation stage, a forward bias is added to the n left screening cells or a reverse bias is added to the n right screening cells to exert an influence on the distribution of the difference between the pull-down current driving capacities of the first output terminal and second output terminal of the presetting module so as to change PUF responses output by the strong PUF circuit capable of implementing multi-bit parallel XOR operations in the case of a small difference. PUF responses which are not changed under the forward bias and the reverse bias are determined as stable PUF responses, and PUF responses which are changed under the forward bias and the reverse bias are determined as unstable PUF responses. When at least one of the n left screening signals SL1-SLn is a low level and the n right screening signals SR1-SRn are all high levels, the left screening cell to which the low level is input by the first input terminal is turned on to decrease the pull-down current driving capacity of the first input terminal of the resetting module, and a forward bias for changing the pull-down current driving capacities of the first output terminal and the second output terminal of the presetting module is added manually. When at least one of the n right screening signals SR1-SRn is a low level and the n left screening signals SL1-SLn are all high levels, the right screening cell to which the low level is input by the first input terminal is turned on to decrease the pull-down current driving capacity of the second output terminal of the presetting module, and a reverse bias for changing the pull-down current driving capacities of the first output terminal and the second output terminal of the presetting module is added manually.

Figure 3:
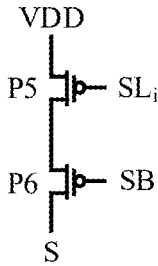
FIG. 3 is a circuit diagram of a left screening cell of the presetting module of the strong PUF circuit capable of implementing multi-bit parallel XOR operations according to the invention.
Figure 4:
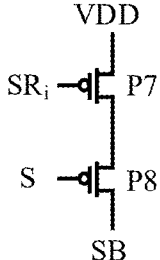
FIG. 4 is a circuit diagram of a right screening cell of the presetting module of the strong PUF circuit capable of implementing multi-bit parallel XOR operations according to the invention.

Embodiment 5: This embodiment is basically the same as Embodiment 4 and is different from Embodiment 4 in the following aspect: as shown in FIGS. 3-4, in this embodiment, each left screening cell comprises a fifth PMOS transistor P5 and a sixth PMOS transistor P6, wherein a source of the fifth PMOS transistor P5 is the power terminal of the left screening cell, a gate of the fifth PMOS transistor P5 is the first input terminal of the left screening cell, a drain of the fifth PMOS transistor P5 and a source of the sixth PMOS transistor P6 are connected, a gate of the sixth PMOS transistor P6 is the second input terminal of the left screening cell, and a drain of the sixth PMOS transistor P6 is the output terminal of the left screening cell; each right screening cell comprises a seventh PMOS transistor P7 and an eighth PMOS transistor P8, wherein a source of the seventh PMOS transistor P7 is the power terminal of the right screening cell, a gate of the seventh PMOS transistor P7 is the first input terminal of the right screening cell, a drain of the seventh PMOS transistor P7 and a source of the eighth PMOS transistor P8 are connected, a gate of the eighth PMOS transistor P8 is the second input terminal of the right screening cell, and a drain of the eighth PMOS transistor P8 is the output terminal of the right screening cell.

Figure 5:
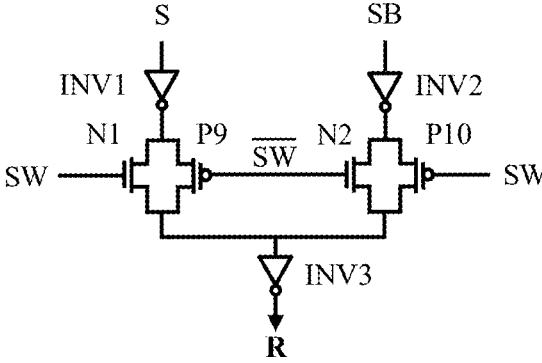
FIG. 5 is a circuit diagram of an interleaving module of the strong PUF circuit capable of implementing multi-bit parallel XOR operations according to the invention.

Embodiment 6: This embodiment is basically the same as Embodiment 3 and is different from Embodiment 3 in the following aspect: as shown in FIG. 5, in this embodiment, the interleaving module comprises a first inverter INV1, a second inverter INV2, a third inverter INV3, a first NMOS transistor N1, a second NMOS transistor N2, a ninth PMOS transistor P9 and a tenth PMOS transistor P10, wherein an input terminal of the first inverter INV1 is the first input terminal of the interleaving module, an input terminal of the second inverter INV2 is the second input terminal of the interleaving module, an output terminal of the first inverter INV1, a drain of the first NMOS transistor N1 and a source of the ninth PMOS transistor P9 are connected, an output terminal of the second inverter INV2, a drain of the second NMOS transistor N2 and a source of the tenth PMOS transistor P10 are connected, a gate of the first NMOS transistor N1 and a gate of the tenth PMOS transistor P10 are connected and a connecting terminal is the selection signal input terminal of the interleaving module, a gate of the ninth PMOS transistor P9 and a gate of the second NMOS transistor N2 are connected, a source of the first NMOS transistor N1, a drain of the ninth PMOS transistor P9, a source of the second NMOS transistor N2, a drain of the tenth PMOS transistor P10 and an input terminal of the third inverter INV3 are connected, and an output terminal of the third inverter INV3 is the output terminal of the interleaving module.

In this embodiment, to improve the distribution uniformity of PUF responses 0 and 1 output by the strong PUF circuit capable of implementing multi-bit parallel XOR operations in the PUF mode, the first input terminal and the second input terminal of the interleaving module are controlled by the clock signal SW to be alternately connected to the output terminal of the interleaving module so as to alternately use response values input to the first input terminal and the second input terminal of the interleaving module as PUF response outputs; when the clock signal SW is a high level "1", the first NMOS transistor N1 and the ninth PMOS transistor P9 are turned on, the second NMOS transistor N2 and the tenth PMOS transistor P10 are turned off, and at this moment, the first input terminal and the output terminal of the interleaving module are connected, that is, the response value input to the first input terminal of the interleaving module is used as a PUF response output; otherwise, when the clock signal SW is a low level "0", the second NMOS transistor N2 and the tenth PMOS transistor P10 are turned on, the first NMOS transistor N1 and the ninth PMOS transistor P9 are turned off, and at this moment, the second input terminal and the output terminal of the interleaving module are connected, that is, the response value input to the second input terminal of the interleaving module is used as a PUF response output, wherein the clock signal SW is an in-phase divided-by-2 frequency signal of the pre-charge signal PRE.

Figure 6:
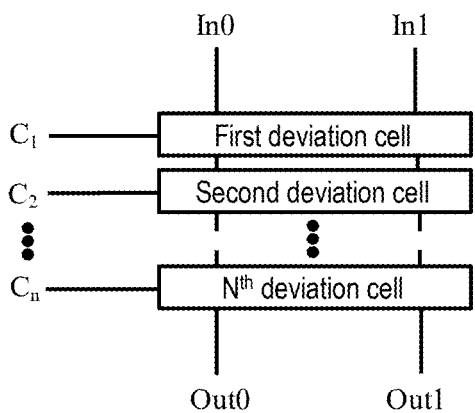
FIG. 6 is a structural diagram of a cascading module of the strong PUF circuit capable of implementing multi-bit parallel XOR operations according to the invention.

Embodiment 7: This embodiment is basically the same as Embodiment 3 and is different from Embodiment 3 in the following aspect: as shown in FIG. 6, in this embodiment, the cascading module comprises n deviation cells, wherein each deviation cell has a signal input terminal, a first input terminal, a second input terminal, a first output terminal and a second output terminal, the signal input terminals of the n deviation cells are the n signal input terminals of the cascading module, the first input terminal of the first deviation cell is the first input terminal of the cascading module, the second input terminal of the first deviation cell is the second input terminal of the cascading module, the first output terminal of the kth deviation cell is connected to the first input terminal of the (k+1)th deviation cell, the second output terminal of the kth deviation cell is connected to the second input terminal of the (k+1)th deviation cell, k=1, 2, . . . , n−1, the first output terminal of the nth deviation cell is the first output terminal of the cascading module, and the second output terminal of the nth deviation cell is the second output terminal of the cascading module.

In this embodiment, each deviation cell determines whether signals input to the first input terminal and the second input terminal pass through the deviation cell in parallel or in a crossed manner according to a signal input to the signal input terminal; when the signal input to the signal input terminal is a high level "1", the first input terminal is connected to the first output terminal, the second input terminal is connected to the second output terminal, and the signals input to the first input terminal and the second input terminal pass through the deviation cell in parallel; or, when the signal input to the signal input terminal is a low level "0", the first input terminal is connected to the second output terminal, and the second input terminal is connected to the first output terminal, and the signals input to the first input terminal and the second input terminal pass through the deviation cell in a crossed manner.

Figure 7:
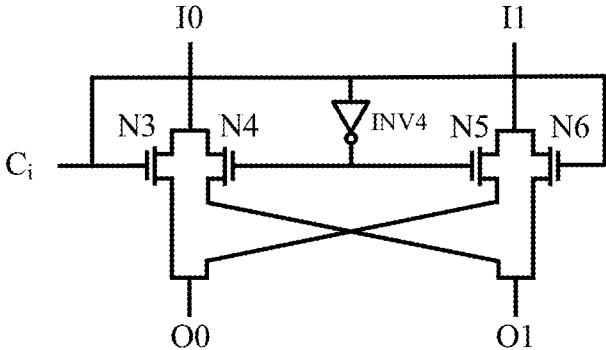
FIG. 7 is a circuit diagram of a deviation cell of the cascading module of the strong PUF circuit capable of implementing multi-bit parallel XOR operations according to the invention.

Embodiment 8: This embodiment is basically the same as Embodiment 7 and is different from Embodiment 7 in the following aspect: as shown in FIG. 7, in this embodiment, each deviation cell comprises a third NMOS transistor N3, a fourth NMOS transistor N4, a fifth NMOS transistor N5, a sixth NMOS transistor N6 and a fourth inverter INV4, wherein an input terminal of the fourth inverter INV4, a gate of the third NMOS transistor N3 and a gate of the sixth NMOS transistor N6 are connected and a connecting terminal is the signal input terminal of the deviation cell, a drain of the third NMOS transistor N3 and a drain of the fourth NMOS transistor N4 are connected and a connecting terminal is the first input terminal of the deviation cell, a drain of the fifth NMOS transistor N5 and a drain of the sixth NMOS transistor N6 are connected and a connecting terminal is the second input terminal of the deviation cell, a gate of the fourth NMOS transistor N4, a gate of the fifth NMOS transistor N5 and an output terminal of the fourth inverter INV4 are connected, a source of the third NMOS transistor N3 and a source of the fifth NMOS transistor N5 are connected and a connecting terminal is the first output terminal of the deviation cell, and a source of the fourth NMOS transistor N4 and a source of the sixth NMOS transistor N6 are connected and a connecting terminal is the second output terminal of the deviation cell.

In this embodiment, when a high level "1" is input to the signal input terminal of the deviation cell, the third NMOS transistor N3 and the sixth NMOS transistor N6 are turned on, the fourth NMOS transistor N4 and the fifth NMOS transistor N5 are turned off, at this moment, the first input terminal and the first output terminal of the deviation cell are connected, and the second input terminal and the second output terminal of the deviation cell are connected; and when a low level "0" is input to the signal input terminal of the deviation cell, the fourth NMOS transistor N4 and the fifth NMOS transistor N5 are turned on, the third NMOS transistor N3 and the sixth NMOS transistor N6 are turned off, at this moment, the first input terminal and the second output terminal of the deviation cell are connected, and the second input terminal and the first output terminal of the deviation cell are connected.

Figure 8:
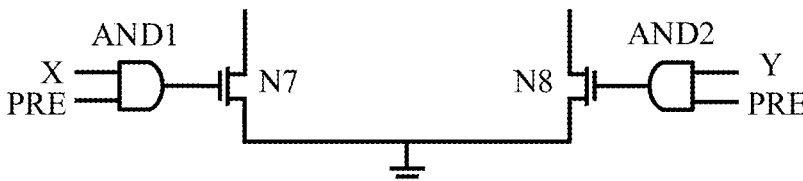
FIG. 8 is a circuit diagram of a control module of the strong PUF circuit capable of implementing multi-bit parallel XOR operations according to the invention.

Embodiment 9: This embodiment is basically the same as Embodiment 3 and is different from Embodiment 3 in the following aspect: as shown in FIG. 8, in this embodiment, the control module comprises a first two-input AND gate AND1, a second two-input AND gate AND2, a seventh NMOS transistor N7 and an eighth NMOS transistor N8, wherein the first two-input AND gate AND1 and the second two-input AND gate AND2 each have a first input terminal, a second input terminal and an output terminal, the first input terminal of the first two-input AND gate AND1 is the first control terminal of the control module, the first input terminal of the second two-input AND gate AND2 is the second control terminal of the control module, the second input terminal of the first two-input AND gate AND1 and the second input terminal of the second two-input AND gate AND2 are connected and a connecting terminal is the pre-charge terminal of the control module, a drain of the seventh NMOS transistor N7 is the first input terminal of the control module, a drain of the eighth NMOS transistor N8 is the second input terminal of the control module, a source of the seventh NMOS transistor N7 and a source of the eighth NMOS transistor N8 are connected and a connecting terminal is the ground terminal of the control module, a gate of the seventh NMOS transistor N7 and the output terminal of the first two-input AND gate AND1 are connected, and a gate of the eighth NMOS transistor N8 and the output terminal of the second two-input AND gate AND2 are connected.

In this embodiment, the first control signal X input to the first control terminal of the control module controls the on-state of the seventh NMOS transistor N7, and the second control signal Y input to the second control terminal of the control module controls the on-state of the eighth NMOS transistor N8. When the first control signal X and the second control signal Y are both high levels, if the pre-charge signal PRE is a low level, the first control signal X and the pre-charge signal PRE undergo an AND operation, the output terminal of the first two-input AND gate AND1 outputs a low level to turn off the seventh NMOS transistor N7, the second control signal Y and the pre-charge signal PRE undergo an AND operation, the output terminal of the second two-input AND gate AND2 outputs a low level to turn off the eighth NMOS transistor N8, and the paths from the two input terminals to the ground terminal of the control module are both cut off; when the pre-charge signal PRE turns from the low level to a high level, the first control signal X and the pre-charge signal PRE undergo an AND operation, the output terminal of the first two-input AND gate AND1 outputs a high level to turn on the seventh NMOS transistor N7, the second control signal Y and the pre-charge signal PRE undergo an AND operation, the output terminal of the second two-input AND gate AND2 outputs a high level to turn on the eighth NMOS transistor N8, and the paths from the two input terminals to the ground terminal of the control module are turned on. When only one of the first control signal X and the second control signal Y is a high level, if the pre-charge signal PRE is a low level, the first control signal X and the pre-charge signal PRE undergo an AND operation, the output terminal of the first two-input AND gate AND1 outputs a low level to turn off the seventh NMOS transistor N7, the second control signal Y and the pre-charge signal PRE undergo an AND operation, the output terminal of the second two-input AND gate AND2 outputs a low level to turn off the eighth NMOS transistor N8, and the paths from the two input terminals to the ground terminal of the control module are cut off; when the pre-charge signal PRE turns from the low level to a high level, if the first control signal X is a high level, the output terminal of the first two-input AND gate AND1 outputs a high level to turn on the seventh NMOS transistor N7, the second control signal Y and the pre-charge signal PRE undergo an AND operation, and the output terminal of the second two-input AND gate AND2 outputs a low level to turn off the eighth NMOS transistor N8; if the first control signal X is a low level, the output terminal of the first two-input AND gate AND1 outputs a low level to turn off the seventh NMOS transistor N7, the second control signal Y and the pre-charge signal PRE undergo an AND operation, the output terminal of the second two-input AND gate AND2 outputs a high level to turn on the eighth NMOS transistor N8, and only one of the paths from the two input terminals to the ground terminal of the control module is turned on, that is, only one on-path is formed in the control module. When the first control signal X and the second control signal Y are both low levels, no matter whether the pre-charge signal PRE is a high level or a low level, the first control signal X and the pre-charge signal PRE undergo an AND operation, the output terminal of the first two-input AND gate AND1 outputs a low level to turn off the seventh NMOS transistor N7, the second control signal Y and the pre-charge signal PRE undergo an AND operation, the output terminal of the second two-input AND gate AND2 outputs a low level to turn off the eighth NMOS transistor N8, and the paths from the two input terminals to the ground terminal of the control module are both cut off.

Figure 9:
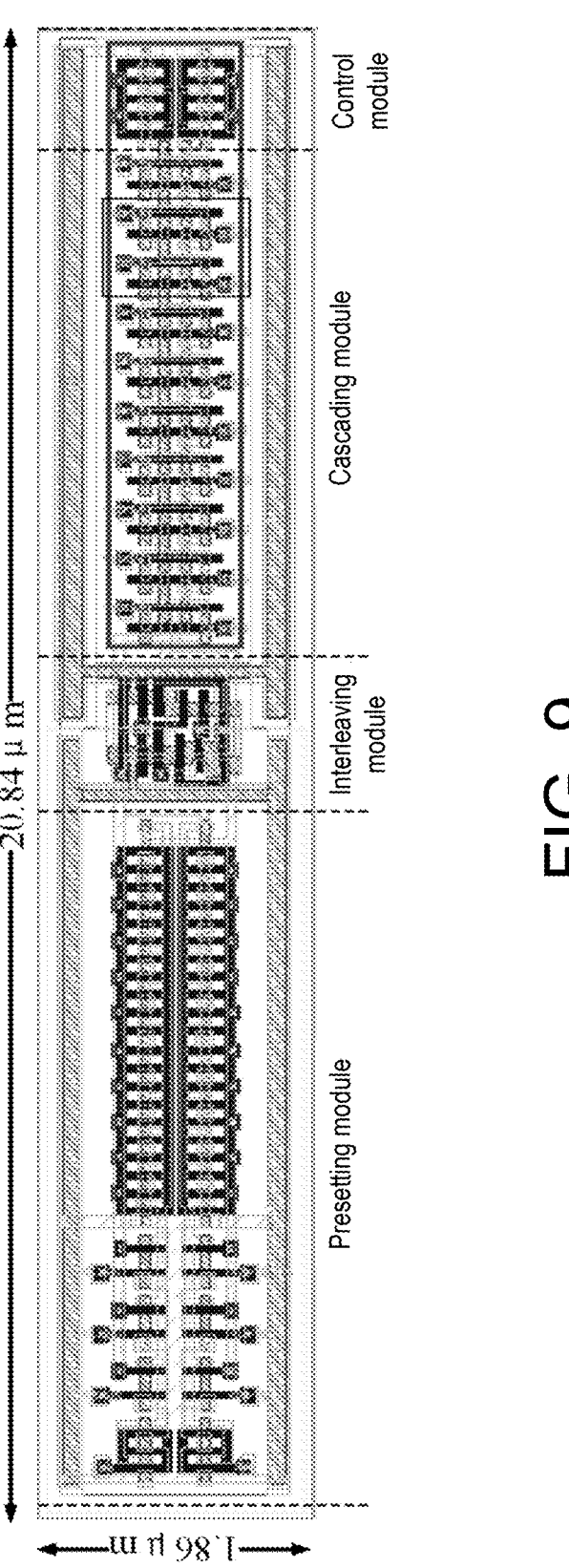
FIG. 9 illustrates the layout of the strong PUF circuit capable of implementing multi-bit parallel XOR operations according to the invention.

The strong PUF circuit capable of implementing multi-bit parallel XOR operations provided by the invention is implemented by a TSMC 65-nm CMOS process. The layout of the strong PUF circuit capable of implementing multi-bit parallel XOR operations provided by the invention is shown in FIG. 9. It can be known, by analyzing FIG. 9, that the area of the layout of the strong PUF circuit capable of implementing multi-bit parallel XOR operations provided by the invention is 20.84 μm×1.86 μm, and the corresponding feature size of a single bit response is only 8.95 F2.

Figure 10:
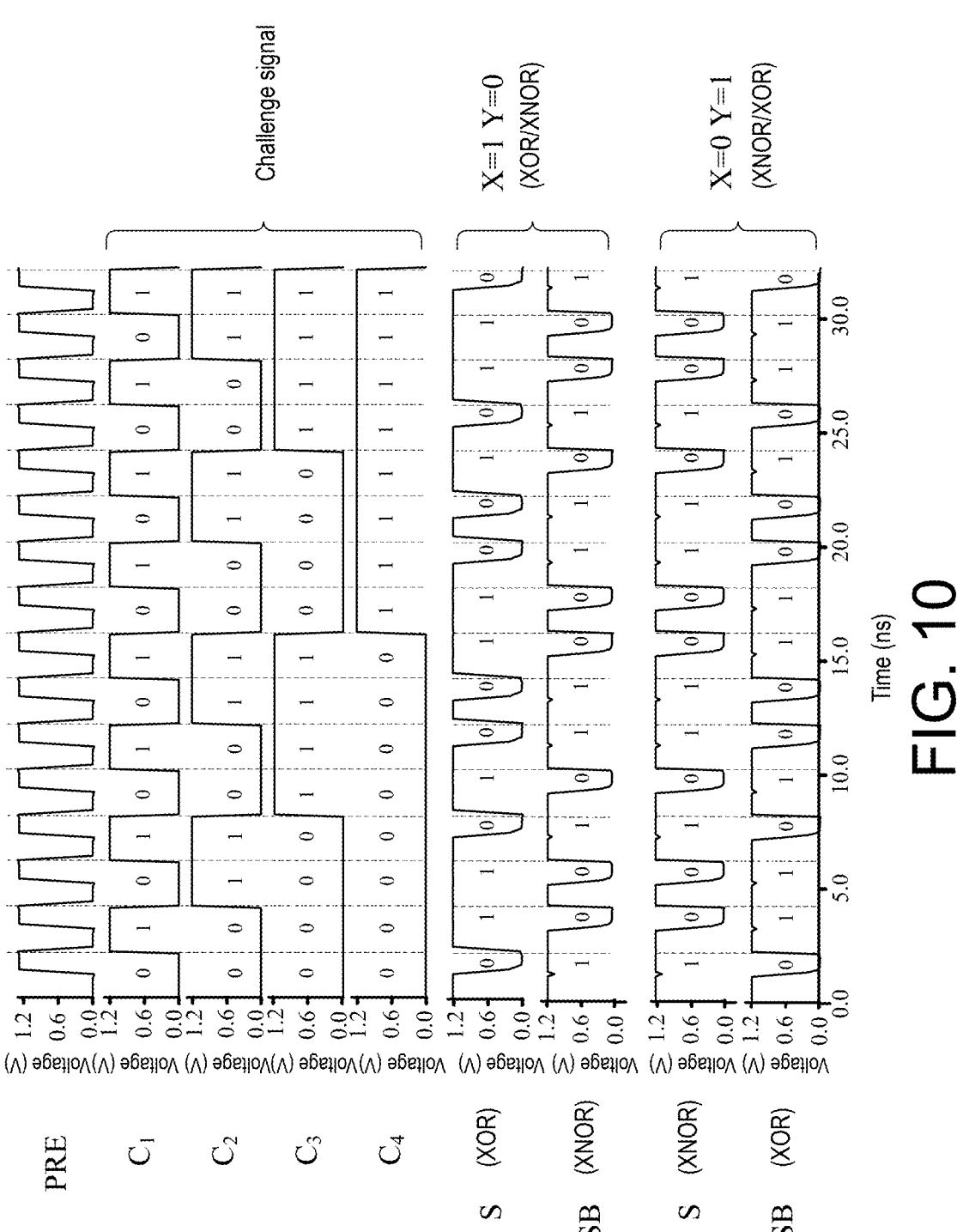
FIG. 10 is a simulation waveform diagram of the logic operation of the strong PUF circuit capable of implementing multi-bit parallel XOR operations according to the invention.

The simulation waveform of the strong PUF circuit capable of implementing multi-bit parallel XOR operations provided by the invention is shown in FIG. 10. In FIG. 10, 4-bit signals C1-Cn are used as XOR operation data. It can be known, by analyzing FIG. 10, that when the first control signal is a high level and the second control signal Y is a low level, that is, XY=10, the first output terminal of the pre-setting module outputs an XOR operation result of the 4-bit signals C1-Cn, and the second output terminal of the pre-setting module outputs an XNOR operation result of the 4-bit signals C1-Cn. When the first control signal X is a low level and the second control signal Y is a high level, that is, XY=01, the first output terminal of the presetting module outputs an XNOR operation result of the 4-bit signals C1-Cn, and the second output terminal of the presetting module outputs an XOR operation result of the 4-bit signals C1-Cn. It thus can be seen that the strong PUF circuit capable of implementing multi-bit parallel XOR operations provided by the invention has a correct logic operation function.

Figure 11:
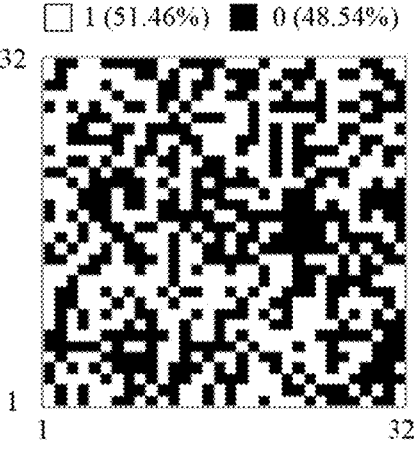
FIG. 11 is a gray mapping image of original PUF responses of the strong PUF circuit capable of implementing multi-bit parallel XOR operations according to the invention.
Figure 12:
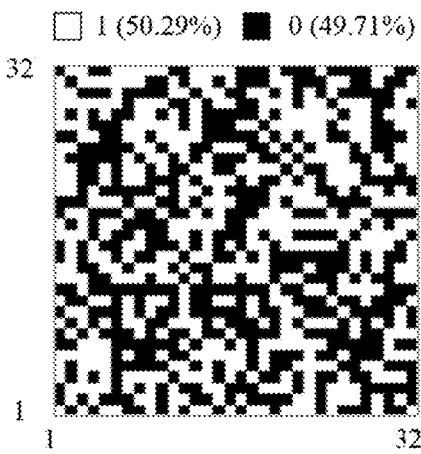
FIG. 12 is a gray mapping image of actual PUF responses of the strong PUF circuit capable of implementing multi-bit parallel XOR operations according to the invention.
Figure 13:
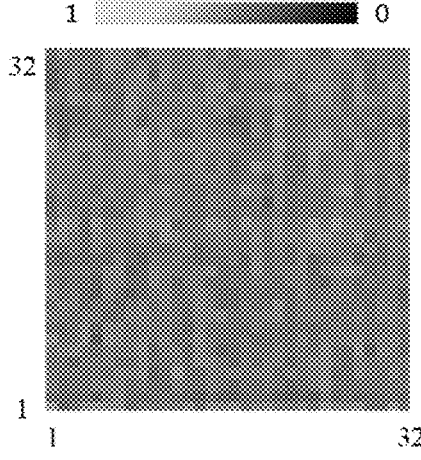
FIG. 13 is an average gray mapping image of the original PUF responses of the strong PUF circuit capable of implementing multi-bit parallel XOR operations according to the invention.
Figure 14:
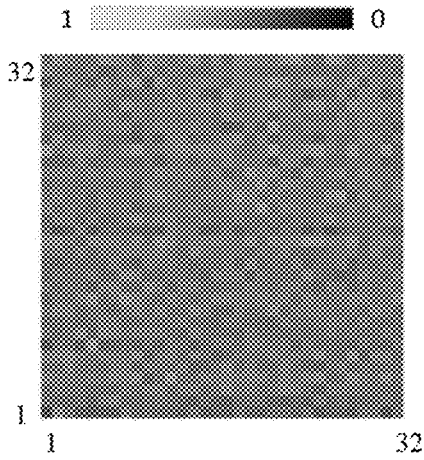
FIG. 14 is an average gray mapping image of the actual PUF responses of the strong PUF circuit capable of implementing multi-bit parallel XOR operations according to the invention.

The randomness is one important attribute of the PUF and is visually observed by a gray image and an average gray image. The gray image and average gray image of the strong PUF circuit capable of implementing multi-bit parallel XOR operations provided by the invention are obtained after 64 Monte Carlo simulations. The gray mapping image of original PUF responses (the two response values output by the presetting module) of the strong PUF circuit capable of implementing multi-bit parallel XOR operations provided by the invention is shown in FIG. 11, the gray mapping image of actual PUF responses of the strong PUF circuit capable of implementing multi-bit parallel XOR operations provided by the invention is shown in FIG. 12, the average gray mapping image of the original PUF responses (the two response values output by the presetting module) of the strong PUF circuit capable of implementing multi-bit parallel XOR operations provided by the invention is shown in FIG. 13, and the average mapping image of the actual PUF responses of the strong PUF circuit capable of implementing multi-bit parallel XOR operations provided by the invention is shown in FIG. 14. In FIGS. 11-14, the black pixel indicates logic "0", and the white pixel indicates logic "1".

It can be known, by analyzing FIG. 11, that the probability of 1 is 51.46%, the probability of 0 is 48.54%, and the randomness is close to a desired value 50%. It can be known, by analyzing FIG. 12, that the probability of 1 is 50.29%, the probability of 0 is 49.71%, and the randomness is close to 50%. It can be known, by analyzing FIGS. 13 and 14, that, by setting the PUF responses output by the interleaving module, the strong PUF circuit capable of implementing multi-bit parallel XOR operations provided by the invention has better randomness, and by interleaving the two response values output by the presetting module by means of the interleaving module, the spatial independence of the PUF responses is improved.

Figure 15:
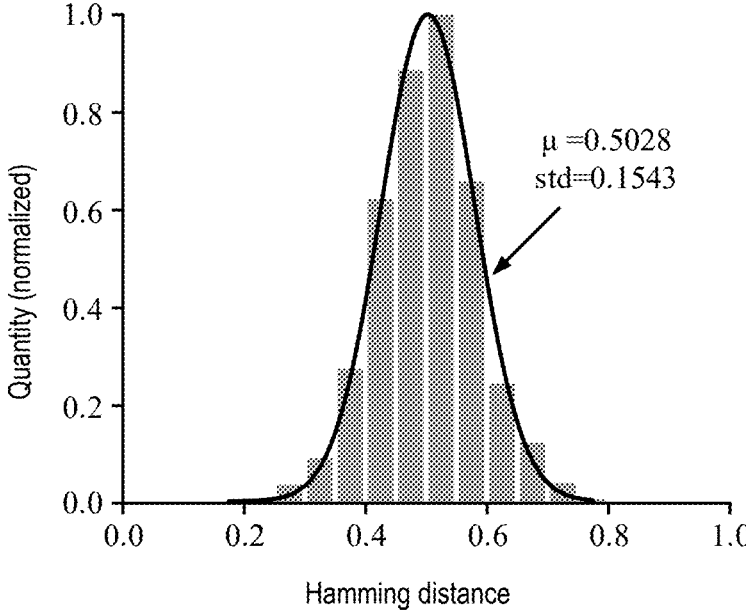
FIG. 15 is a simulated chart of the inter-Hamming distance of PUF responses of the strong PUF circuit capable of implementing multi-bit parallel XOR operations according to the invention.

The uniqueness is used for representing the distinction between any one individual output response and other individual output responses of the same PUF and is measured generally by the average inter-Hamming distance (HD). The simulated chart of the inter-Hamming distance of the PUF responses of the strong PUF circuit capable of implementing multi-bit parallel XOR operations provided by the invention is shown in FIG. 15. It can be known, by analyzing FIG. 15, that the fitted curve of the normalized probability distribution follows the Gaussian distribution with a mean value of 0.5028 and standard difference of 0.1543. It thus can be seen that the uniqueness of the strong PUF circuit capable of implementing multi-bit parallel XOR operations provided by the invention is 50.28%, which is close to a desired value 50%.

Figure 16:
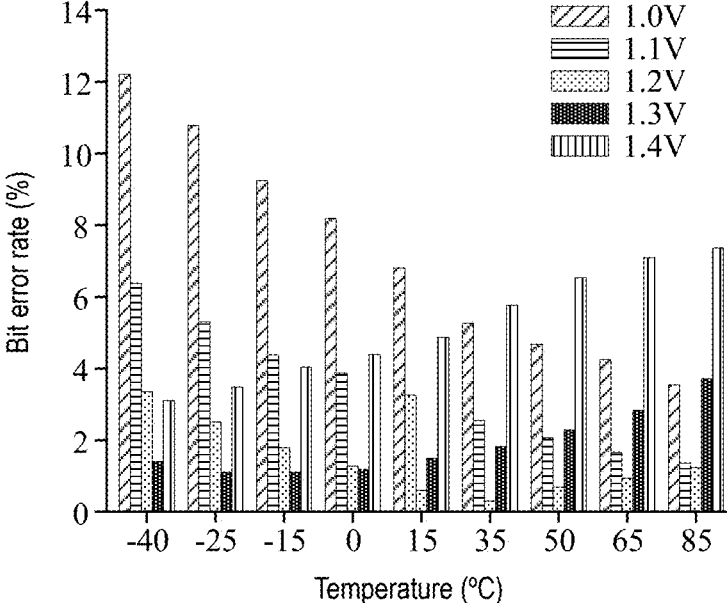
FIG. 16 is a simulated chart of the stability of PUF responses of the strong PUF circuit capable of implementing multi-bit parallel XOR operations under different temperatures and voltages according to the invention.

The stability is another important attribute of the PUF. The stability of responses of the PUD is directly related to the availability and security of the PUF and is generally evaluated by the bit error rate (BER). The simulated chart of the stability of the strong PUF circuit capable of implementing multi-bit parallel XOR operations provided by the invention under different temperatures (–40° C.-85° C.) and voltages (1.0V-1.4V) is shown in FIG. 16. It can be known, by analyzing FIG. 16, that the strong PUF circuit capable of implementing multi-bit parallel XOR operations provided by the invention has high stability.

The strong PUF circuit capable of implementing multi-bit parallel XOR operations provided by the invention can improve the stability of PUF responses by screening out x instable bits, so as to reduce the bit error rate, wherein x is any integer from 1 to n and indicates the number of bits that are screened out. Specifically, Step 1: n left screening signals SL1-SLn and n right screening signals are input to the presetting module, wherein x signals are randomly selected from the left screening signals SL1-SLn and are set as low-level signals, the other n-x left screening signals and the n right screening signals are all set as high-level signals, the first control signal X and the second control signal Y are input to the control module to allow the strong PUF circuit capable of implementing multi-bit parallel XOR operations to operate in the PUF mode, a challenge signal is input to the n signal input terminals of the cascading module, the clock signal SW is input to the selection signal input terminal of the cascading module, and at this moment, the presetting module makes a determination according to the challenge signal input to the cascading module, and the output terminal of the interleaving module outputs a first PUF response. Step 2: the challenge signal, the first control signal X and the second control signal Y input in step 1 remain unchanged, x signals are randomly selected from the right screening signals SR1-SRn and set as low-level signals, the other n-x right screening signals and the n left screening signals are all set as high-level signals, and the output terminal of the interleaving module outputs a second PUF response. Third, the first PUF response is compared with the second PUF response; if the first PUF response is identical with the second PUF response, the PUF response corresponding to the challenge is determined as a stable PUF response; otherwise, the PUF response corresponding to the challenge is determined as an unstable PUF response.

Figure 17:
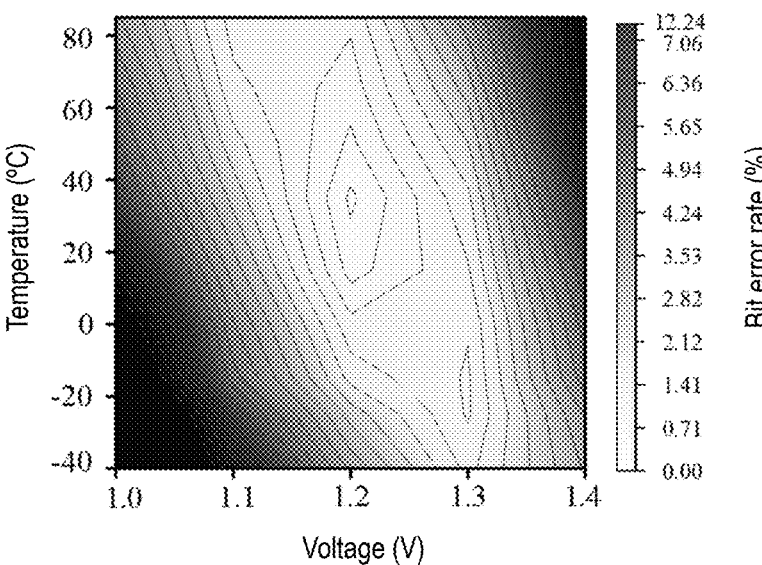
FIG. 17 is a graph of the original bit error rate of the PUF responses of the strong PUF circuit capable of implementing multi-bit parallel XOR operations according to the invention.
Figure 18:
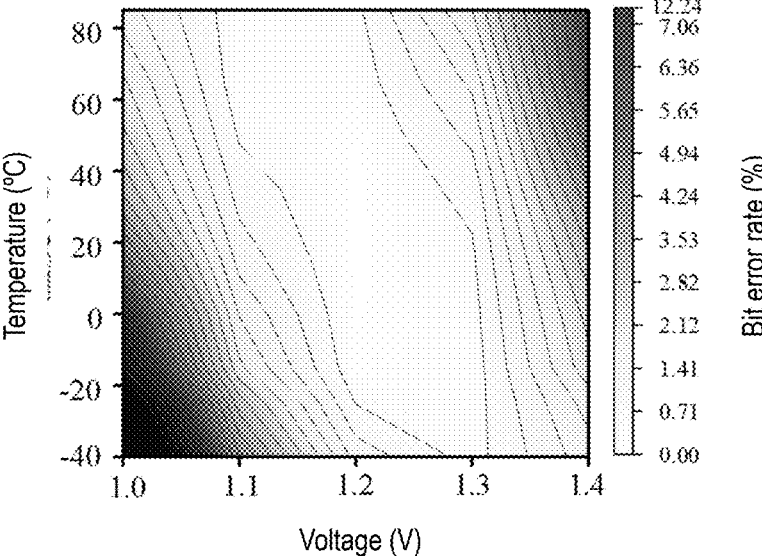
FIG. 18 is a graph of the bit error rate of the PUF responses of the strong PUF circuit capable of implementing multi-bit parallel XOR operations according to the invention in a case where one instable bit is screened out.
Figure 19:
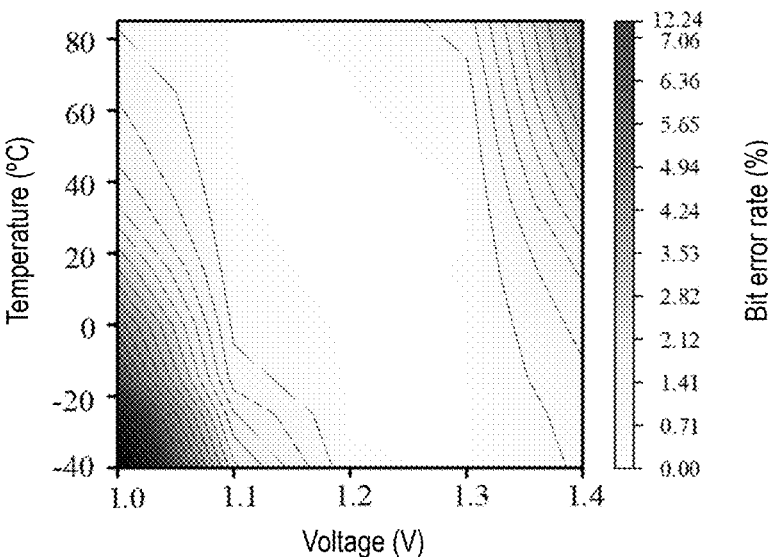
FIG. 19 is a graph of the bit error rate of the PUF responses of the strong PUF circuit capable of implementing multi-bit parallel XOR operations according to the invention in a case where two instable bits screened out.
Figure 20:
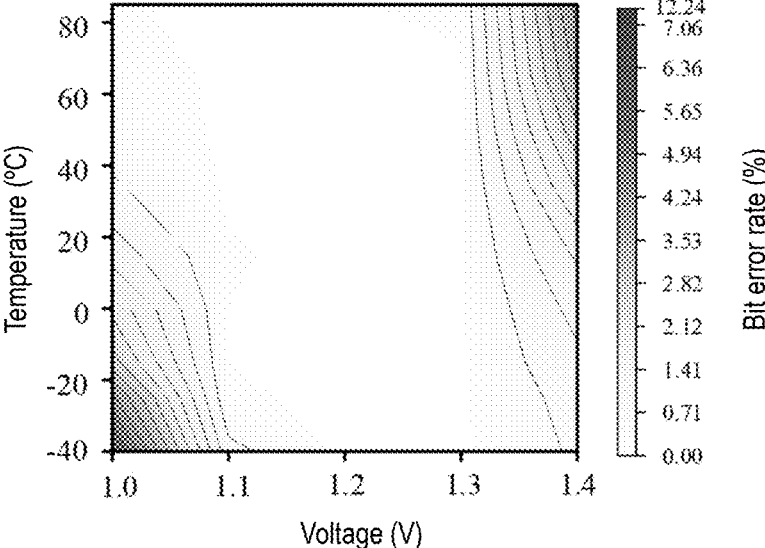
FIG. 20 is a graph of the bit error rate of the PUF responses of the strong PUF circuit capable of implementing multi-bit parallel XOR operations according to the invention in a case where three instable bits screened out.

FIG. 17 illustrates the original bit error rate of the strong PUF circuit capable of implementing multi-bit parallel XOR operations under –40° C.-85° C. and 1.0 V-1.4 V, and FIGS. 18-20 are results obtained in cases where of 1-3 instable bits are screened out. It can be known, by analyzing FIGS. 17-20, that the bit error rate of the PUF response will be reduced with the increase of the number of instable bits that are screened out.

To sum up, the strong PUF circuit capable of implementing multi-bit parallel XOR operations provided by the invention can replace a separated PUF circuit and an XOR operation circuit to be applied to edge AI chips so as to reduce the area and hardware resource expenditure of the edge AI chips and improve the calculation efficiency of the edge AI chips; in addition, the instable bit screening technique is adopted to improve the stability of PUF responses, and in actual use, whether an output PUF response is a stable PUF response can be determined by screening out x instable bits, the output PUF response will be eliminated if it is an unstable PUF response, and only stable PUF responses will be reserved. By adopting the instable bit screening method, the stability of PUF responses of the strong PUF circuit capable of implementing multi-bit parallel XOR operations can be remarkably improved, and the bit error rate of the strong PUF circuit capable of implementing multi-bit parallel XOR operations is reduced.

What is claimed is:

1. A strong PUF circuit capable of implementing multi-bit parallel XOR operations, comprising a presetting module, an interleaving module, a cascading module and a control module, wherein the control module is used for controlling an operating mode of the strong PUF circuit capable of implementing multi-bit parallel XOR operations, and under the control of the control module, the strong PUF circuit capable of implementing multi-bit parallel XOR operations is able to operate in a PUF mode, a logic operation mode or a power control mode;

in response to the strong PUF circuit capable of implementing multi-bit parallel XOR operations operates in the PUF mode, the cascading module is used for controlling the presetting module to generate two reverse response values, and the interleaving module is used for alternately selecting the two response values generated by the presetting module as PUF response outputs of the strong PUF circuit capable of implementing multi-bit parallel XOR operations;

in response to the strong PUF circuit capable of implementing multi-bit parallel XOR operations operates in the logic operation mode, the cascading module is used for inputting XOR operation data, controlling the presetting module to generate an XOR operation result and an XNOR operation result and outputting the XOR operation result and the XNOR operation result; and in response to the strong PUF circuit capable of implementing multi-bit parallel XOR operations operates in the power control mode, low-power operation of the strong PUF circuit capable of implementing multi-bit parallel XOR operations is realized.

2. A strong PUF circuit capable of implementing multi-bit parallel XOR operations according to claim 1, wherein in response to the strong PUF circuit capable of implementing multi-bit parallel XOR operations operates in the PUF mode, the presetting module is able to improve the stability of the two generated response values by screening out instable bits, so as to reduce the bit error rate.

3. A strong PUF circuit capable of implementing multi-bit parallel XOR operations according to claim 2, wherein the presetting module has a power terminal, a pre-charge terminal, n left screening signal input terminals, n right screening signal input terminals and two output terminals, wherein n is an integer which is greater than or equal to 1, the two output terminals of the presetting module are referred to as a first output terminal and a second output terminal respectively, an operating supply voltage VDD is accessed to the power terminal of the presetting module, a pre-charge signal PRE is input to the pre-charge terminal of the presetting module, n left screening signals SL1-SLn are input to the n left screening signal input terminals of the presetting module, and n right screening signals SR1-SRn are input to the n right screening signal input terminals of the presetting module; the interleaving module has two input terminals, a selection signal input terminal and an output terminal, the two input terminals of the interleaving module are referred to as a first input terminal and a second input terminal respectively, and a clock signal SW is input to the selection signal input terminal of the interleaving module;

wherein the cascading module has n signal input terminals, two input terminals and two output terminals, the two input terminals of the cascading module are referred to as a first input terminal and a second input terminal respectively, and the two output terminals of the cascading module are referred to a first output terminal and a second output terminal respectively;

wherein the control module has two input terminals, two control terminals, a pre-charge terminal and a ground terminal, the two input terminals of the control module are referred to a first input terminal and a second input terminal respectively, the two control terminals of the control module are referred to a first control terminal and a second control terminal respectively, a first control signal X is input to the first control terminal of the control module, a second control signal Y is input to the second control terminal of the control module, the pre-charge signal PRE is input to the pre-charge terminal of the control module, and a ground voltage VSS is accessed to the ground terminal of the control module; the first output terminal of the presetting module is connected to the first input terminal of the interleaving module and the first input terminal of the cascading module, the second output terminal of the presetting module is connected to the second input terminal of the interleaving module and the second input terminal of the cascading module, the first output terminal of the cascading module is connected to the first input terminal of the control module, and the second output terminal of the cascading module is connected to the second input terminal of the control module;

wherein in response to the strong PUF circuit capable of implementing multi-bit parallel XOR operations operates in the logic operation mode, the n signal input terminals of the cascading module function as n data input terminals of the strong PUF circuit capable of implementing multi-bit parallel XOR operations and allow the XOR operation data to be input thereto, the first output terminal of the presetting module functions as a first output terminal of the strong PUF circuit capable of implementing multi-bit parallel XOR operations and is used for outputting the XOR operation result or the XNOR operation result, and the second output terminal of the presetting module functions as a second output terminal of the strong PUF circuit capable of implementing multi-bit parallel XOR operations and is used for outputting the XNOR operation result or the XOR operation result; and in the case where the strong PUF circuit capable of implementing multi-bit parallel XOR operations operates in the PUF mode, the n signal input terminals of the cascading module function as n challenge terminals of the strong PUF circuit capable of implementing multi-bit parallel XOR operations and allow challenge signals to be input thereto, and the output terminal of the interleaving module functions as a PUF response output terminal of the strong PUF circuit capable of implementing multi-bit parallel XOR operations and is used for outputting PUF responses.

4. A strong PUF circuit capable of implementing multi-bit parallel XOR operations according to claim 3, wherein the presetting module comprises a first PMOS transistor, a second PMOS transistor, a third PMOS transistor, a fourth PMOS transistor, n left screening cells and n right screening cells;

wherein each left screening cell has a power terminal, two input terminals and an output terminal, and the two input terminals of the left screening cell are referred to as a first input terminal and a second input terminal respectively;

wherein each right screening cell has a power terminal, two input terminals and an output terminal, and the two input terminals of the right screening cell are referred to as a first input terminal and a second input terminal respectively;

wherein a source of the first PMOS transistor, a source of the second PMOS transistor, a source of the third PMOS transistor, a source of the fourth PMOS transistor, the power terminals of the n left screening cells and the power terminals of the n right screening cells are connected and a connecting terminal is the power terminal of the presetting module, a gate of the third PMOS transistor and a gate of the fourth PMOS transistor are connected and a connecting terminal is the pre-charge terminal of the presetting module, the first input terminals of the n left screening cells are the n left screening signal input terminals of the presetting module, the first input terminals of the n right screening cells are the n right screening signal input terminals of the presetting module, a drain of the first PMOS transistor, a gate of the second PMOS transistor, a drain of the third PMOS transistor, the second input terminals of the n right screening cells and the output terminals of the n left screening cells are connected and a connecting terminal is the first output terminal of the presetting module, and a drain of the second PMOS transistor, a gate of the first PMOS transistor, a drain of the fourth PMOS transistor, the output terminals of the n right screening cells and the second input terminals of the n left screening cells are connected and a connecting terminal is the second output terminal of the presetting module.

5. A strong PUF circuit capable of implementing multi-bit parallel XOR operations according to claim 4, wherein each left screening cell comprises a fifth PMOS transistor and a sixth PMOS transistor, wherein a source of the fifth PMOS transistor is the power terminal of the left screening cell, a gate of the fifth PMOS transistor is the first input terminal of the left screening cell, a drain of the fifth PMOS transistor and a source of the sixth PMOS transistor are connected, a gate of the sixth PMOS transistor is the second input terminal of the left screening cell, and a drain of the sixth PMOS transistor is the output terminal of the left screening cell;

wherein each right screening cell comprises a seventh PMOS transistor and an eighth PMOS transistor, wherein a source of the seventh PMOS transistor is the power terminal of the right screening cell, a gate of the seventh PMOS transistor is the first input terminal of the right screening cell, a drain of the seventh PMOS transistor and a source of the eighth PMOS transistor are connected, a gate of the eighth PMOS transistor is the second input terminal of the right screening cell, and a drain of the eighth PMOS transistor is the output terminal of the right screening cell.

6. A strong PUF circuit capable of implementing multi-bit parallel XOR operations according to claim 3, wherein the interleaving module comprises a first inverter, a second inverter, a third inverter, a first NMOS transistor, a second NMOS transistor, a ninth PMOS transistor and a tenth PMOS transistor, wherein an input terminal of the first inverter is the first input terminal of the interleaving module, an input terminal of the second inverter is the second input terminal of the interleaving module, an output terminal of the first inverter, a drain of the first NMOS transistor and a source of the ninth PMOS transistor are connected, an output terminal of the second inverter, a drain of the second NMOS transistor and a source of the tenth PMOS transistor are connected, a gate of the first NMOS transistor and a gate of the tenth PMOS transistor are connected and a connecting terminal is the selection signal input terminal of the interleaving module, a gate of the ninth PMOS transistor and a gate of the second NMOS transistor are connected, a source of the first NMOS transistor, a drain of the ninth PMOS transistor, a source of the second NMOS transistor, a drain of the tenth PMOS transistor and an input terminal of the third inverter are connected, and an output terminal of the third inverter is the output terminal of the interleaving module.

7. A strong PUF circuit capable of implementing multi-bit parallel XOR operations according to claim 3, wherein the cascading module comprises n deviation cells, wherein each deviation cell has a signal input terminal, a first input terminal, a second input terminal, a first output terminal and a second output terminal, the signal input terminals of the n deviation cells are the n signal input terminals of the cascading module, the first input terminal of the first deviation cell is the first input terminal of the cascading module, the second input terminal of the first deviation cell is the second input terminal of the cascading module, the first output terminal of the $k^{th}$ deviation cell is connected to the first input terminal of the $(k+1)^{th}$ deviation cell, the second output terminal of the $k^{th}$ deviation cell is connected to the second input terminal of the $(k+1)^{th}$ deviation cell, k=1, 2, . . . , n−1, the first output terminal of the nth deviation cell is the first output terminal of the cascading module, and the second output terminal of the nth deviation cell is the second output terminal of the cascading module.

8. A strong PUF circuit capable of implementing multi-bit parallel XOR operations according to claim 7, wherein each deviation cell comprises a third NMOS transistor, a fourth NMOS transistor, a fifth NMOS transistor, a sixth NMOS transistor and a fourth inverter, wherein an input terminal of the fourth inverter, a gate of the third NMOS transistor and a gate of the sixth NMOS transistor are connected and a connecting terminal is the signal input terminal of the deviation cell, a drain of the third NMOS transistor and a drain of the fourth NMOS transistor are connected and a connecting terminal is the first input terminal of the deviation cell, a drain of the fifth NMOS transistor and a drain of the sixth NMOS transistor are connected and a connecting terminal is the second input terminal of the deviation cell, a gate of the fourth NMOS transistor, a gate of the fifth NMOS transistor and an output terminal of the fourth inverter are connected, a source of the third NMOS transistor and a source of the fifth NMOS transistor are connected and a connecting terminal is the first output terminal of the deviation cell, and a source of the fourth NMOS transistor and a source of the sixth NMOS transistor are connected and a connecting terminal is the second output terminal of the deviation cell.

9. A strong PUF circuit capable of implementing multi-bit parallel XOR operations according to claim 3, wherein the control module comprises a first two-input AND gate, a second two-input AND gate, a seventh NMOS transistor and an eighth NMOS transistor, wherein the first two-input AND gate and the second two-input AND gate each have a first input terminal, a second input terminal and an output terminal, the first input terminal of the first two-input AND gate is the first control terminal of the control module, the first input terminal of the second two-input AND gate is the second control terminal of the control module, the second input terminal of the first two-input AND gate and the second input terminal of the second two-input AND gate are connected and a connecting terminal is the pre-charge terminal of the control module, a drain of the seventh NMOS transistor is the first input terminal of the control module, a drain of the eighth NMOS transistor is the second input terminal of the control module, a source of the seventh NMOS transistor and a source of the eighth NMOS transistor are connected and a connecting terminal is the ground terminal of the control module, a gate of the seventh NMOS transistor and the output terminal of the first two-input AND gate are connected, and a gate of the eighth NMOS transistor and the output terminal of the second two-input AND gate are connected.

* * * * *